(12) United States Patent
Doyle et al.

(10) Patent No.: US 8,169,027 B2
(45) Date of Patent: May 1, 2012

(54) SUBSTRATE BAND GAP ENGINEERED MULTI-GATE PMOS DEVICES

(75) Inventors: Brian S. Doyle, Portland, OR (US); Been-Yih Jin, Lake Oswego, OR (US); Jack T. Kavalieros, Portland, OR (US); Suman Datta, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/757,917

(22) Filed: Apr. 9, 2010

(65) Prior Publication Data

US 2010/0193840 A1  Aug. 5, 2010

Related U.S. Application Data

(62) Division of application No. 11/393,168, filed on Mar. 29, 2006, now abandoned.

(51) Int. Cl.
*H01L 29/66* (2006.01)
(52) U.S. Cl. ......... 257/353; 257/354; 257/347; 438/164
(58) Field of Classification Search .................. 257/353, 257/354, 347; 438/164
See application file for complete search history.

(56) References Cited

U.S. PATENT DOCUMENTS

| | | |
|---|---|---|
| 5,804,848 A | 9/1998 | Mukai |
| 5,844,278 A | 12/1998 | Mizuno et al. |
| 5,899,710 A | 5/1999 | Mukai |
| 6,018,176 A | 1/2000 | Lim |
| 6,066,869 A | 5/2000 | Noble et al. |
| 6,413,802 B1 | 7/2002 | Hu et al. |
| 6,459,123 B1 | 10/2002 | Enders et al. |
| 6,472,258 B1 | 10/2002 | Adkisson et al. |
| 6,525,403 B2 | 2/2003 | Inaba et al. |
| 6,562,665 B1 | 5/2003 | Yu |
| 6,583,469 B1 | 6/2003 | Fried et al. |
| 6,611,029 B1 | 8/2003 | Ahmed et al. |
| 6,630,386 B1 | 10/2003 | Yu |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,657,259 B2 | 12/2003 | Fried et al. |
| 6,689,650 B2 | 2/2004 | Gambino et al. |
| 6,770,516 B2 | 8/2004 | Wu et al. |
| 6,787,402 B1 | 9/2004 | Yu |
| 6,794,718 B2 | 9/2004 | Nowak et al. |
| 6,798,000 B2 | 9/2004 | Luyken et al. |

(Continued)

OTHER PUBLICATIONS

Choi, et al., "Sub-20nm CMOS FinFET Technologies," IEEE, IEDM, 2001, 4 pages.

(Continued)

*Primary Examiner* — Phat X Cao
(74) *Attorney, Agent, or Firm* — Blakely, Sokoloff, Taylor & Zafman LLP

(57) ABSTRACT

A multi-gate transistor and a method of forming a multi-gate transistor, the multi-gate transistor including a fin having an upper portion and a lower portion. The upper portion having a first band gap and the lower portion having a second band gap with the first band gap and the second band gap designed to inhibit current flow from the upper portion to the lower portion. The multi-gate transistor further including a gate structure having sidewalls electrically coupled with said upper portion and said lower portion and a substrate positioned below the fin.

17 Claims, 5 Drawing Sheets

U.S. PATENT DOCUMENTS

| | | |
|---|---|---|
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,849,884 B2 | 2/2005 | Clark et al. |
| 6,869,868 B2 | 3/2005 | Chiu et al. |
| 6,885,055 B2 | 4/2005 | Lee |
| 6,897,527 B2 | 5/2005 | Dakshina-Murthy et al. |
| 7,115,945 B2 * | 10/2006 | Lee et al. .............. 257/329 |
| 2005/0116218 A1 | 6/2005 | Yang |
| 2006/0076625 A1 | 4/2006 | Lee et al. |
| 2007/0032024 A1 | 2/2007 | Peidous et al. |
| 2007/0102763 A1 * | 5/2007 | Yeo et al. .............. 257/353 |

OTHER PUBLICATIONS

Final Office Action for U.S. Appl. No. 11/393,168, mailed Dec. 9, 2009, 10 pages.

Office Action for U.S. Appl. No. 11/393,168, mailed May 5, 2009, 11 pages.

Final Office Action for U.S. Appl. No. 11/393,168, mailed Dec. 24, 2008, 11 pages.

Office Action for U.S. Appl. No. 11/393,168, mailed Jun. 3, 2008, 8 pages.

Park, et al., "Pi-Gate SOI MOSFET", IEEE Electron Device Letters, vol. 22, No. 8, Aug. 2001, 2 pages.

* cited by examiner

US 8,169,027 B2

SUBSTRATE BAND GAP ENGINEERED MULTI-GATE PMOS DEVICES

CROSS-REFERENCE TO RELATED APPLICATIONS

This application is a divisional of U.S. patent application Ser. No. 11/393,168, filed Mar. 29, 2006, entitled "SUBSTRATE BAND GAP ENGINEERED MULTI-GATE PMOS DEVICES," the entire contents of which are hereby incorporated by reference herein.

BACKGROUND OF THE INVENTION

1. Field of the Invention

The present invention relates to the field of semiconductor devices and more specifically to controlling short-channel effects in multi-gate devices.

2. Discussion of Related Art

During the past two decades, the physical dimensions of MOSFETs have been aggressively scaled for low-power, high-performance applications. The need for faster switching transistors requires shorter channel lengths. The continued decreasing size and need for low-power transistors makes overcoming the short channel effects of transistors necessary. However, as the dimensions of the transistors decrease the ability to control the leakage current becomes more difficult. To limit the amount of leakage current in a transistor current solutions involve strictly controlling the placement of the source and drain dopants within the active region of the transistor. Other techniques to combat the leakage current include implants in and around the channel such as halo and punch-through implants. However, the use of such implants results in degraded performance of the transistor such as increasing the threshold voltage.

Multi-gate devices enable better control of the transistor channel than do planar transistors with a single gate. The use of more than one gate in the channel region of the transistor allows more control over the current flow within the channel. The better control over the channel minimizes short-channel effects. Despite the better control over the channel, the multi-gate devices are less efficient at controlling the electric fields from the source and drain regions. The electric fields from the source and drain regions result in short-channel effects such as an increased leakage current at a given gate voltage in the subthreshold region of device operation. As mentioned above, prior solutions to minimize this leakage current includes utilizing dopants in the channel that have unwanted effects such as increasing the threshold voltage of the transistor.

SUMMARY

A multi-gate transistor and a method of forming a multi-gate transistor, the multi-gate transistor including a fin having an upper portion and a lower portion. The upper portion having a first band gap and the lower portion having a second band gap with the first band gap and the second band gap designed to inhibit current flow from the upper portion to the lower portion. The multi-gate transistor further including a gate structure having sidewalls electrically coupled with said upper portion and said lower portion and a substrate positioned below the fin.

DETAILED DESCRIPTION

In the following description of substrate band gap engineered multi-gate pMOS devices numerous specific details are set forth in order to provide an understanding of the claims. One of ordinary skill in the art will appreciate that these specific details are not necessary in order to practice the disclosure. In other instances, well-known semiconductor fabrication processes and techniques have not been set forth in particular detail in order to prevent obscuring the present invention.

Embodiments of the present invention include band gap engineered multi-gate pMOS devices. In particular embodiments of the multi-gate pMOS device, the device is fabricated with a fin or body formed from a layer of material deposited over a substrate and a portion of the substrate. The layer of material deposited over a substrate and the substrate are selected such that the band gap of the material deposited over the substrate is narrower than that of the substrate. The difference in the band gap creates a band gap offset between the valence bands of the two layers, which adds an extra barrier for the holes to mount in order to move into the substrate. The result of the band gap offset is to minimize the leakage current into the substrate. Another aspect of embodiments of a pMOS device according to the present invention includes forming a source region and a drain region fully contained within the layer of material deposited over the substrate. Because the source region and drain region are fully contained within the layer of material deposited over a substrate the leakage current in the substrate is minimized.

Embodiments of the present invention also include a gate structure that is electrically coupled with the layer of material deposited over a substrate and at least a part of the substrate portion of the fin. The band gap offset between the materials of the fin changes the flat-band voltage of this part of the device. The result is a lower threshold voltage in the material deposited over the substrate than the threshold voltage of the substrate portion of the fin because of the band gap offset between the two materials. The higher threshold voltage in the substrate portion of the fin helps to further minimize the leakage current. Minimizing the transistor leakage current provides for lower power, high performance transistors. Moreover, the ability to better control the leakage current allows the transistor to be scaled to smaller dimensions.

Figure 1:
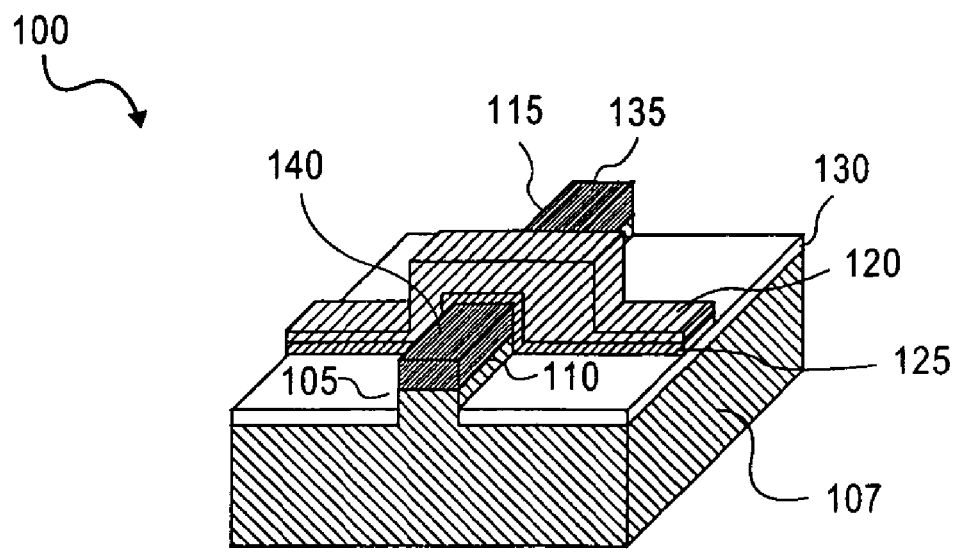
FIG. 1 is an illustration of a perspective view of an embodiment of a multi-gate pMOS device using substrate band gap engineering.

FIG. 1 shows an embodiment of a substrate band gap engineered multi-gate pMOS device 100. In the FIG. 1 embodiment, a fin or body 105 is formed from two materials. In an embodiment, the fin 105 has a lower portion 110 formed from a substrate and an upper portion 115 formed from a semiconductor material that has a band gap at least 0.3 electron volts (eV) narrower than the substrate portion 110. In embodiments of the pMOS device 100 according to the present invention the materials for the upper portion 115 and the lower portion 110 are selected such that the band gap offset between the upper portion 115 and the lower portion 110 is equal to or greater than 0.3 eV. For example, in one embodiment the materials of the upper portion 115 and the lower portion 110 are selected such that the band gap of the upper portion 115 is approximately 0.3 eV narrower than that of the material selected for the lower portion 110. In another embodiment, the band-gap offset between the upper portion 115 and the lower portion 110 is approximately 0.4 eV.

The difference in the band gap of the lower portion 110 and an upper portion 115 creates an extra barrier for holes to overcome before escaping into the lower portion 110. This extra barrier results in reducing the number of holes that can travel from the upper portion to the lower portion; therefore, the leakage current is reduced. Having a lower portion 110 with a band gap equal to or greater than 0.3 eV larger than an upper portion 115 also creates a lower threshold voltage in the upper portion 115 than in the lower portion 110. The difference in the threshold voltages between the upper portion 115 and the lower portion 110 increases in the same amount as the band-gap offset between the two portions. The resulting higher flat-band voltage in the lower portion 110 further minimizes the leakage current in the lower portion 110.

In an embodiment of a multi-gate pMOS device 100 according to the present invention, an epitaxial semiconductor layer forms an upper portion 115 having a band gap approximately 0.3 eV to approximately 0.4 eV narrower than the band gap of the lower portion 110 that is positioned over the lower portion 110. In an embodiment of the present invention the upper portion 115 is formed from a composition of silicon-germanium. One embodiment of the pMOS device 100 includes the use of silicon-germanium with 20-50 atomic percent of germanium for the upper portion 115 and silicon for the lower portion 110. In an embodiment using silicon-germanium, the silicon-germanium includes 30 atomic percent of germanium. Another embodiment of pMOS device 100 using silicon-germanium contains 20 atomic percent of germanium in the silicon-germanium upper portion 115. In other embodiments of a pMOS device 100 of the present invention, a substrate 107 may be formed of any semiconductor material having a band gap equal to or greater than 0.3 eV than an upper portion 115.

In some embodiments the thickness of the upper portion 115 is 3 to 20 times thicker than the lower portion 110. In one embodiment the thickness of the upper portion 115 is between approximately 200 angstroms (Å) and 800 Å. Embodiments of a pMOS device 100 according to the present invention include the lower portion 110 having a thickness between approximately 10 Å and 200 Å. An embodiment of the pMOS device 100 includes an upper portion 115 having a thickness of approximately 450 Å and a lower portion have a thickness of 50 Å.

The embodiment illustrated in FIG. 1 of a substrate band gap engineered multi-gate pMOS device 100 further includes a gate structure 120. In an embodiment, a gate structure 120 resides over a gate insulator 125. Some embodiments of a substrate band gap engineered multi-gate pMOS device 100 include a gate insulator 125 positioned over shallow trench isolation (STI) regions 130 formed on a substrate 107. In an embodiment, a gate structure 120 may be fabricated as illustrated in FIG. 1 such that the substrate band gap engineered multi-gate pMOS device 100 is a tri-gate transistor. In a tri-gate transistor embodiment the gate structure 120 is formed on the top surface of a fin 105 and on the sidewalls of a fin 105. In a FinFET embodiment of the pMOS device 100 according to the present invention, the gate structure 120 is formed on laterally opposite sidewalls of a fin 105. In other embodiments, a gate structure 120 may be fabricated in such a manner as to form other dual-gate or omega-gate devices.

Figure 2:
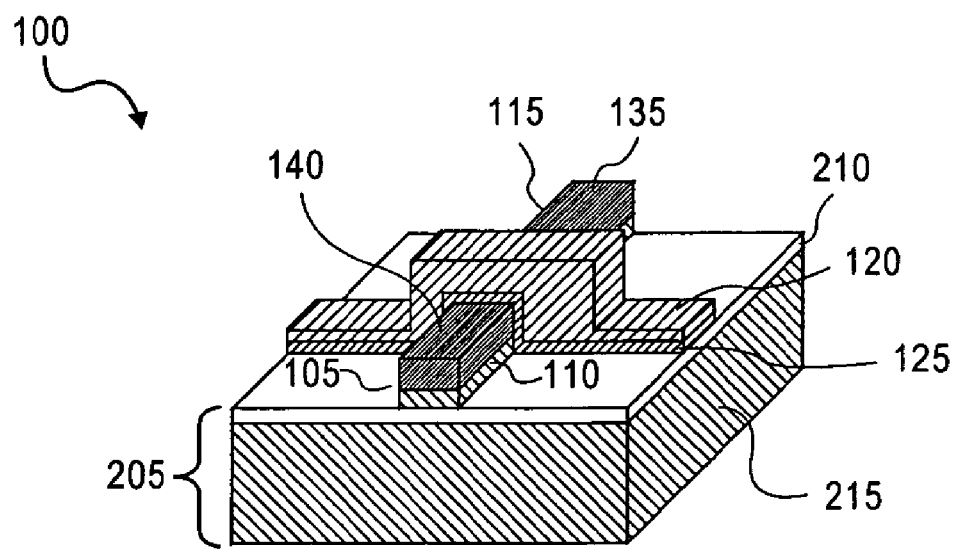
FIG. 2 is an illustration of a perspective view of an embodiment of a multi-gate pMOS device on an insulating substrate using substrate band gap engineering.

FIG. 2 illustrates another embodiment of a substrate band gap engineered multi-gate pMOS device 100 fabricated in a semiconductor-on-insulator (SOI) configuration but is otherwise similar to the FIG. 1 embodiment. In an embodiment of an SOI configuration, substrate 205 is formed from an insulator 210 and a carrier 215. The insulator 210 may be any dielectric material such as silicon dioxide. The carrier 215 of an SOI configuration may be any semiconductor, insulator, or metallic material.

In the embodiments depicted in FIGS. 1 and 2, the multi-gate pMOS device 100 has a gate insulator 125. Other embodiments according to the present invention include a pMOS device 100 without a gate insulator 125. In one embodiment the gate structure 120 is in direct contact with the fin 105. In the tri-gate embodiments as illustrated in FIGS. 1 and 2 the gate insulator 125 covers the top and the sidewalls of the fin 105. In other embodiments, such as FinFET, a gate dielectric layer 125 is only formed on the sidewalls of the fin 105. Gate insulator 125 may be made of any dielectric material compatible with materials forming a fin 105 and materials forming a gate structure 120. In an embodiment of the present invention, the gate dielectric layer 125 may be formed from a silicon dioxide ($SiO_2$), a silicon oxynitride ($SiO_xN_y$), or a silicon nitride ($Si_3N_4$) dielectric layer. In one particular embodiment of the pMOS device 100, the gate dielectric layer 125 is formed from a silicon oxynitride layer formed to a thickness of 5-20 Å. In another embodiment, a gate dielectric layer 125 is formed from a high K gate dielectric layer such as a metal oxide dielectric, including but not limited to tantalum oxide, titanium oxide, hafnium oxide, zirconium oxide, or aluminum oxide. Gate dielectric layer 125 may also be formed from materials including other types of high K dielectrics, such as lead zirconium titanate (PZT).

In certain embodiments of the pMOS device 100, a gate structure 120 is formed on and adjacent to the gate dielectric layer 125. When formed according to an embodiment of the present invention, a gate structure 120 has a pair of laterally opposite sidewalls separated by a distance defining the gate length ($L_g$) of the pMOS device 100. In an embodiment of the present invention, the gate electrode may be formed of any material having an appropriate work function. A gate structure 120 in an embodiment of the pMOS device 100 of the present invention is formed from a metal gate electrode, such as tungsten, tantalum nitride, titanium silicide, nickel silicide, or cobalt silicide. Another embodiment of the present invention includes a gate structure 120 fabricated from a composite stack of thin films such as a metal/polycrystalline silicon electrode.

Embodiments of the pMOS device 100 include a gate structure 120 formed to couple with the top of fin 105, the sidewalls of an upper portion 115, and the sidewalls of a lower portion 110. In a tri-gate embodiment, the gate structure 120 covers the top of a fin 105 and extends between approximately 5 Å and 200 Å below the top of a lower portion 110. In another embodiment, the gate structure 120 extends 25 Å below the top of a lower portion 110. In a FinFET embodiment only the sidewall portion of a gate structure 120 is used; therefore, the top of a fin 105 is not covered by a portion of a gate structure. In a FinFET embodiment of a pMOS device 100 according to the present invention a gate structure includes sidewalls to electrically couple to an upper portion 115 and a lower portion 110. One FinFET embodiment of the pMOS device 100 includes a gate structure that extends approximately 5 Å and 200 Å below the top of the lower portion 110. In another FinFET embodiment of the pMOS device 100 a gate structure extends 25 Å below the top of a lower portion 110.

The embodiments illustrated in FIGS. 1 and 2 also include a source region 135 and a drain region 140 formed in the upper portion 115 on opposite sides of a gate structure 120. In an embodiment of a substrate band gap engineered pMOS device 100, a source region 135 and a drain region 140 are fully contained within an upper portion 115. Fully containing a source region 135 and a drain region 140 within an upper portion 115 also aids in minimizing the leakage current in a lower portion 110. Some embodiments of the present invention have a doping concentration of $1 \times 10^{19}$-$1 \times 10^{21}$ atoms/cm$^3$. An embodiment of the pMOS device 100 includes a source region 135 and a drain region 140 formed of a uniform doping concentration. In another embodiment, a source region 135 and a drain region 140 include subregions of different doping concentrations or doping profiles such as tip regions. In an embodiment including tip regions, sidewall spacers are used to create tip regions.

As shown in FIGS. 1 and 2, a source region 135 and a drain region 140 define a channel region in the fin 105 of the pMOS device. In an embodiment of the present invention a channel region is undoped. Another embodiment of the pMOS device 100 includes a channel region doped to a concentration as high as $1 \times 10^{19}$ atoms/cm$^3$. Some embodiments of the present invention include halo implants implanted below the channel region of a half order magnitude greater than the doping concentration of the channel region and the same conductivity type as the channel region. The halo implants work to further minimize the leakage of a pMOS device 100. Other embodiments of the present invention include punchthrough implants or other techniques to combat short-channel effects.

Figure 3A:
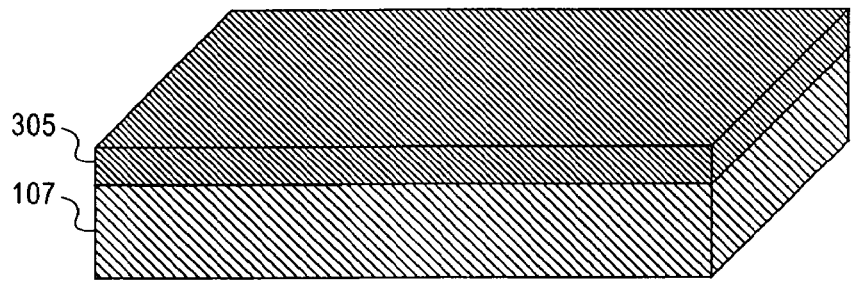
FIG. 3A-3F is an illustration of perspective views of a method of fabricating an embodiment of a multi-gate pMOS device using substrate band gap engineering.

A method of fabricating a pMOS device 100 on a substrate in accordance with an embodiment of the present invention as shown in FIG. 1 is illustrated in FIGS. 3A-3F. In certain embodiments of the present invention, the substrate 107 of FIG. 3A can be a semiconductor layer, such as a silicon monocrystalline substrate. As shown in FIG. 3A, an upper portion layer 305 is deposited over a substrate 107. In one embodiment the upper portion layer 305 is formed from part of the substrate 107. Another embodiment of the pMOS device 100 includes an upper portion layer 305 that is an epitaxial layer formed on substrate 107. In an embodiment, the upper portion layer 305 is formed to a thickness between approximately 200 Å and 800 Å. One embodiment of the pMOS device 100 includes an upper portion layer 305 formed to a thickness of approximately 450 Å. Another embodiment of the pMOS device 100 includes the pMOS device 100 including an upper portion layer 305 formed to a thickness of approximately 600 Å. In certain embodiments of the present invention, the upper portion layer 305 is a composition of a silicon-germanium alloy having a band gap at least 0.3 eV narrower than the substrate 107. In an embodiment, the upper portion layer 305 includes an epitaxial region with p-type conductivity with an impurity concentration level between $1 \times 10^{16}$-$1 \times 10^{19}$ atoms/cm$^3$. In another embodiment of the present invention the upper portion layer 305 is an undoped silicon-germanium alloy layer having a band gap at least 0.4 eV narrower than the band gap of the substrate 107.

In embodiments of the present invention, well regions of upper portion layer 305 are doped to p-type conductivity with a concentration level between about $1 \times 10^{16}$-$1 \times 10^{19}$ atoms/cm$^3$. Upper portion layer 305 can be doped by, for example, ion-implantation. The doping level of the upper portion layer 305 at this point may determine the doping level of the channel region of a pMOS device 100.

Figure 3B:
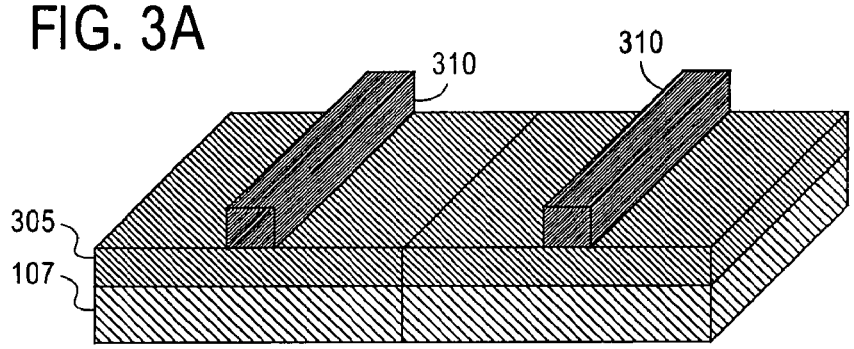
Figure 3C:
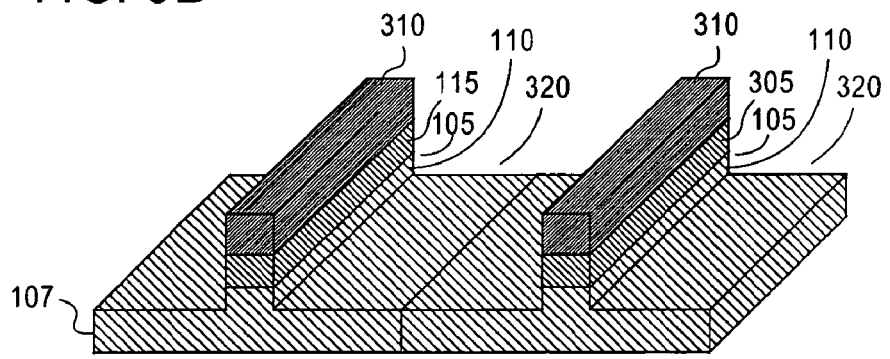

As shown in FIG. 3B, a masking layer 310 is used to define the active regions of the pMOS device 100 on the upper portion layer 305. A masking layer 310 is used to define the active regions of an embodiment of a pMOS device 100 of the present invention. The masking layer 310 may be any material suitable for defining an upper portion layer 305 and a substrate 107. In an embodiment of the present invention, masking layer 310 is a lithographically defined photo resist. In another embodiment, masking layer 310 is formed of a dielectric material that has been lithographically defined and then etched. In an embodiment, masking layer 310 is a hard mask. In a certain embodiment, masking layer 310 may be a composite stack of materials, such as an oxide/nitride stack. Once masking layer 310 has been defined, a fin or body 105 is then defined, as shown in FIG. 3C, by an etching technique. The fin 105 having an upper portion 115 and a lower portion 110. In certain embodiments of the present invention, anisotropic plasma etch, or RIE, is used to define a fin 105. Moreover, FIG. 3C shows the upper portion layer 305 and a portion of the substrate 107 etched to form recesses or trenches 320 on the substrate 107 in alignment with the outside edges of masking portion 310. The trenches 320 are etched to a depth sufficient to isolate an adjacent transistor from the other. In an embodiment of the pMOS device 100 the trench 320 between approximately 500 Å and 2000 Å deep in the substrate 107. In one embodiment the trench 320 is etched to a depth of 1500 Å in the substrate 107.

Figure 3D:
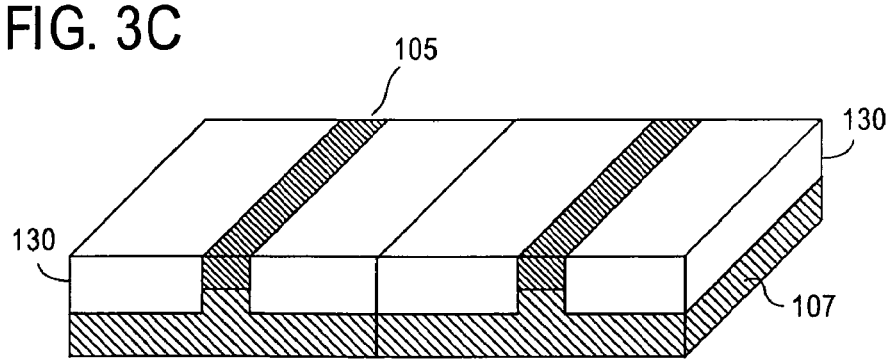

As shown in FIG. 3D, the trenches 320 are filled with a dielectric to form STI regions 130 on substrate 107. In an embodiment of the present invention, a liner of oxide or nitride on the bottom and sidewalls of the trenches 320 is formed. Next, the trenches 320 are filled by blanket depositing an oxide over the liner by, for example, a high-density plasma (HDP) chemical vapor deposition process. The deposition process will also form dielectric on the top surfaces of the mask portions 310. The fill dielectric layer can then be removed from the top of mask portions 310 by chemical, mechanical, or electrochemical, polishing techniques. The polishing is continued until the mask portions 310 are revealed, forming STI regions 130. In an embodiment of the present invention, as shown in FIG. 3D, the mask portions 310 are selectively removed. In other embodiments, the mask portions 310 are retained through subsequent processes.

Figure 3E:
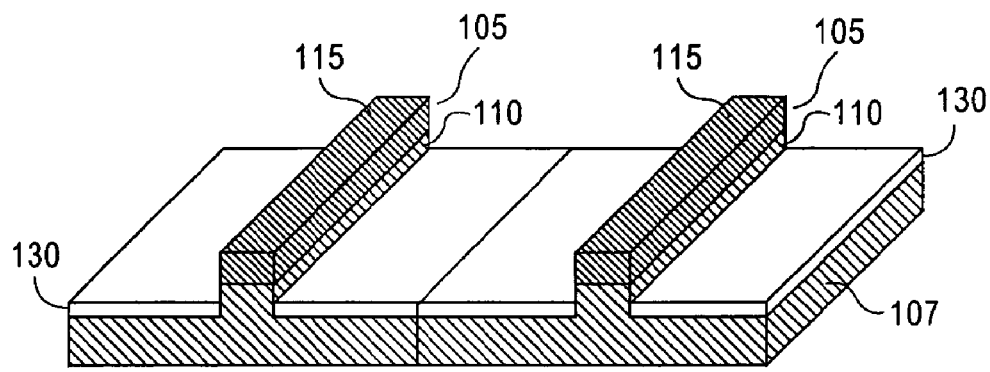

In the embodiment shown in FIG. 3E, the STI regions 130 are etched back or recessed to form the sidewalls of the fin 105. STI regions 130 are etched back with an etchant, which does not significantly etch the fin 105. In an embodiment, STI regions 130 are recessed such that the amount of the lower portion 110 that is exposed is within a range between 200 Å and 800 Å. In one embodiment, STI regions 130 are recessed using an anisotropic etch followed by an isotropic etch to remove the STI dielectric from the sidewalls of a fin 105 until 500 Å of the substrate 107 is exposed. STI regions 130 are recessed by an amount dependent on the desired channel width of the pMOS device 100 formed.

Figure 3F:
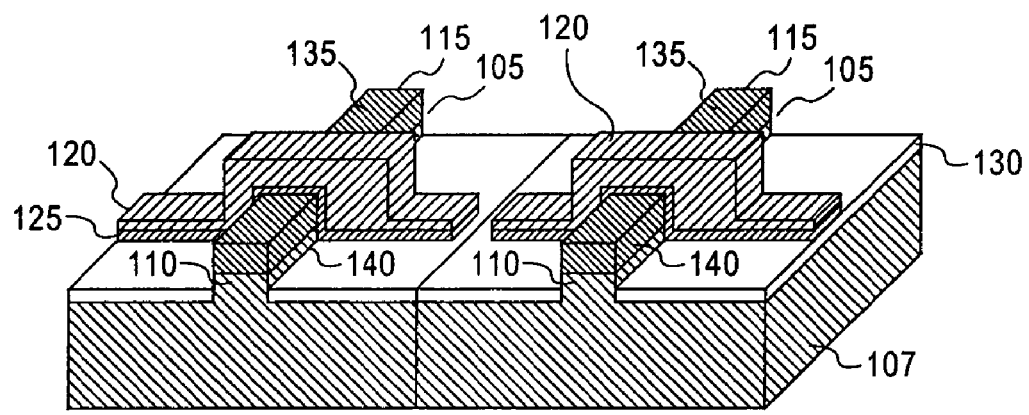

A gate dielectric layer 125, as shown in FIG. 3F, is formed on each upper portion 115 and lower portion 110 of fin 105 in a manner dependent on the type of device (dual-gate, tri-gate, etc.). In an embodiment of the present invention, a gate dielectric layer 125 is formed on the top surface of an upper portion 115, as well as on the laterally opposite sidewalls of a fin 105. In certain embodiments, such as dual-gate embodiments, the gate dielectric 125 is not formed on the top surface of the upper portion 115, but on the top surface of hard mask. The gate dielectric layer 125 can be a deposited dielectric or a grown dielectric. In an embodiment of the present invention, the gate dielectric layer 125 is a silicon dioxide dielectric film grown with a dry/wet oxidation process. In an embodiment of the present invention, the gate dielectric film 125 is a deposited high dielectric constant (high-K) metal oxide dielectric, such as tantalum pentaoxide, titanium oxide, hafnium oxide, zirconium oxide, aluminum oxide, or another high-K dielectric, such as barium strontium titanate (BST). A high-K film can be formed by well-known techniques, such as chemical vapor deposition (CVD) and atomic layer deposition (ALD).

As shown in FIG. 3F, a gate structure 120 is formed on the pMOS device 100. In an embodiment of the present invention, the gate structure 120 is formed on the gate dielectric layer 125 formed on and adjacent to the top surface of the upper portion 115 and is formed on and adjacent to the gate dielectric 125 formed on and adjacent to the sidewalls of fin 105, which includes the sidewalls of the upper portion 115 and the lower portion 110. The gate structure 120 may be formed to a thickness between 200-3000 Å. In an embodiment, the gate structure 120 has a thickness of at least three times the height of a fin 105. In an embodiment of the present invention, the gate electrode is a mid-gap metal gate electrode such as, tungsten, tantalum nitride, titanium nitride or titanium silicide, nickel silicide, or cobalt silicide. In an embodiment of the present invention, gate structure 120 is formed by techniques including but not limited to blanket depositing a gate structure 120 material over the substrate 107 and then patterning the gate electrode material through photolithography and etch. In other embodiments of the present invention, "replacement gate" methods are used to form the gate structure 120.

Source region 135 and drain region 140 for the transistor are formed in upper portion 115 on opposite sides of gate structure 120, as shown in FIG. 3F. In an embodiment of a pMOS device according to the present invention, a source region 135 and a drain region 140 resides on opposite sides of a channel. An embodiment of the present invention the source region 135 and drain region 140 region are completely contained in the upper portion 115. In an embodiment of the present invention, a source region 135 and a drain region 140 include tip or source/drain extension regions. For an embodiment of a pMOS device 100 of the present invention, an upper portion 115 is doped to a p-type conductivity and to a concentration between $1\times10^{19}$-$1\times10^{21}$ atoms/cm$^3$. At this point an embodiment of a pMOS device 100 according to the present invention is substantially complete and only device interconnection remains.

A method of fabricating a substrate band gap engineered pMOS device 100 on an insulating substrate in accordance with an embodiment of the present invention as shown in FIG. 2 is illustrated in FIGS. 4A-4D. Forming a pMOS device 100 on an insulating substrate according to an embodiment of the present invention may use similar techniques and materials as described for the embodiments illustrated by FIGS. 3A-3F. In an embodiment of the present invention, shown in FIG. 4A, the SOI substrate 205 includes an insulating layer 210, such as a silicon dioxide film or silicon nitride film, formed over a lower silicon carrier 215. Insulating layer 210 isolates lower portion layer 410 and upper portion layer 305 from carrier 205, and in an embodiment is formed to a thickness between 200-2000 Å. In an embodiment, insulating layer 210 is sometimes referred to as a "buried oxide" layer.

Although the upper portion layer 305 is ideally a silicon-germanium alloy (SiGe), other types of semiconductor films may be used so long as the band gap of the upper portion layer 305 is at least 0.3 eV narrower than that of the lower portion layer 410. Such semiconductor films may include compositions of any III-V semiconductor compounds that results in at least a 0.3 eV narrower band gap than that of the lower portion layer 410.

In an embodiment of the present invention, upper portion layer 305 is an intrinsic (i.e., undoped) silicon germanium alloy film having 30 atomic percent of germanium. In other embodiments, upper portion layer 305 is doped to p-type conductivity with a concentration level between $1\times10^{16}$-$1\times10^{19}$ atoms/cm$^3$. Upper portion layer 305 can be in-situ doped (i.e., doped while it is deposited) or doped after it is formed on substrate 107 by for example ion-implantation. The doping level of the upper body layer 305 at this point can determine the doping level of the channel region of the device. Upper body layer 305 may be formed on insulator 210 in any well-known method. In one method of forming a silicon-on-insulator substrate, known as the separation by implantation of oxygen (SIMOX) technique. Another technique currently used to form SOI substrates is an epitaxial silicon film transfer technique generally referred to as bonded SOI or SMART-CUT.

Figure 4A:
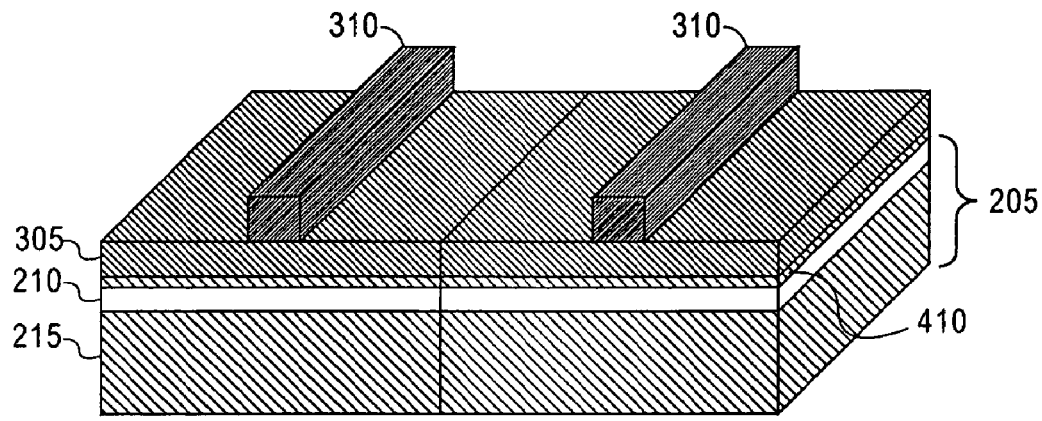
FIG. 4A-4D is an illustration of perspective views of a method of fabricating an embodiment of a multi-gate pMOS device on an insulating substrate using substrate band gap engineering.
Figure 4B:
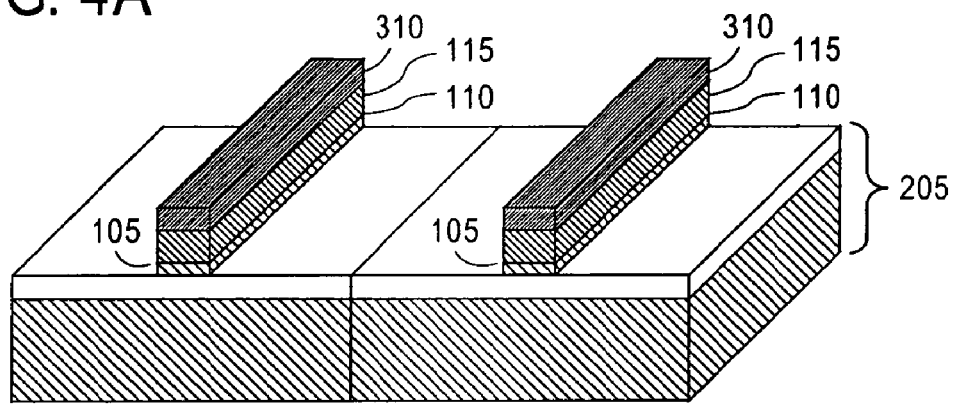
Figure 4C:
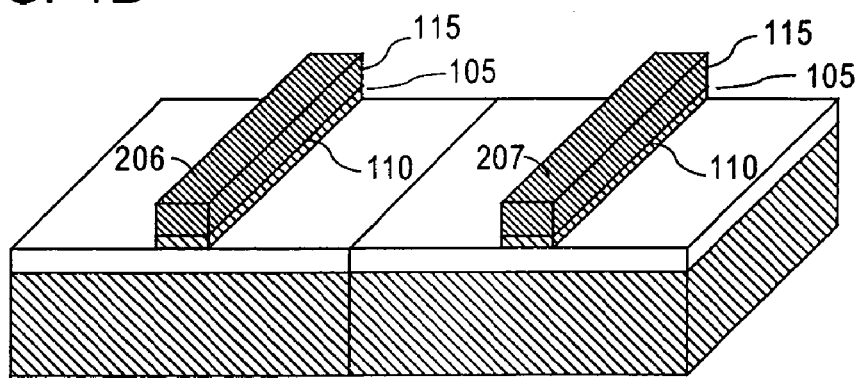

Similar to the process described in FIGS. 3A-3F, a masking layer 310 is used to define the active regions of a pMOS device 100. As shown in FIG. 4B, once a masking layer 310 has been defined, a fin 105 is then defined by an etching technique to expose the sidewalls of a body portion 115 and a substrate portion 110. In an embodiment of the present invention, as shown in FIG. 4C, masking layer 310 is removed from the upper portion 115. In other embodiments, such as for particular dual-gate or FinFET designs, masking layer 310 is not removed.

In a particular embodiment of the present invention, the upper portion 115 is a silicon-germanium layer having an atomic percent of germanium within a range of about 20 atomic percent to about 50 atomic percent. In an embodiment the amount of germanium in a silicon-germanium upper portion 115 is within a range of about 25 to 35 atomic percent. In other embodiments, the germanium concentration is about 50 percent. Ideally, the formation process for creating the silicon germanium layer is capable of producing a single crystalline upper portion 115. As in the process described in FIGS. 3A-3F, the upper portion 115 is grown to the desired thickness, some embodiments include in-situ impurity doping. In an embodiment of the present invention, a SiGe is grown to a thickness in the range of approximately 200 Å and 800 Å. One embodiment of the pMOS device 100 includes an upper portion layer 305 formed to a thickness of approximately 450 Å. In certain embodiments of the present invention, various regions over the substrate are selectively and iteratively masked and different devices such as nMOS devices, other pMOS devices, or other circuit components may be formed.

Figure 4D:
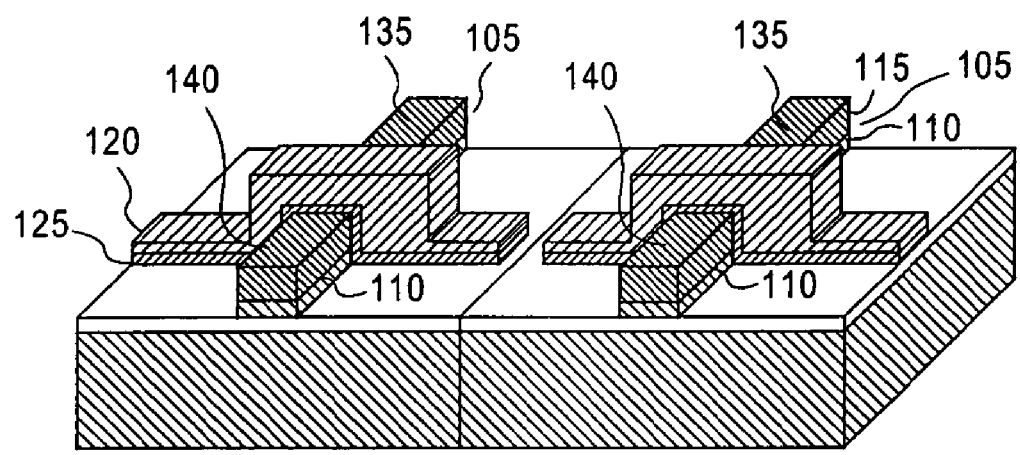

As shown in FIG. 4D, a gate insulator 125, gate structure 120, source regions 135, and drain regions 140 are formed following embodiments analogous to those previously described above. At this point an embodiment of a pMOS device 100 of the present invention formed on a SOI substrate is substantially complete and only device interconnection remains.

Although the invention has been described in language specific to structural features and/or methodological acts, it is to be understood that the invention defined in the appended claims is not necessarily limited to the specific features or acts described. Rather, the specific features and acts are disclosed as particularly graceful implementations of the claimed invention.

We claim:
1. A multi-gate pMOS transistor comprising:
a fin disposed on a semiconductor substrate, the fin having an upper portion disposed on a lower portion, said upper portion being of a first semiconductor having a first band gap and said lower portion being of a second semiconductor having a second band gap, larger than said first band gap to inhibit current leakage from said upper portion to said lower portion;

a shallow trench isolation (STI) dielectric disposed on the semiconductor substrate adjacent to the fin, the fin extending from the semiconductor substrate through the STI dielectric;

a gate structure electrically coupled with said upper portion and said lower portion to form a channel region in at least said upper portion, the gate structure including a gate dielectric in direct contact with a sidewall of the upper portion and in direct contact with a sidewall of the lower portion of the fin extending above the STI dielectric; and a source region and drain region in the fin on opposite sides of the channel region, wherein the source and drain regions are fully contained within the upper portion of the fin.

2. The multi-gate transistor of claim 1 wherein said first semiconductor is an undoped silicon-germanium alloy and said second semiconductor is a silicon layer of the substrate, and wherein said undoped silicon-germanium alloy comprises 20-50 atomic percent of germanium with said first band gap being at least 0.3 electron volts narrower than said second band gap, wherein the difference in the band gap creates a band gap offset between the valence bands of the upper and lower portions of the fin.

3. The multi-gate transistor of claim 1 wherein the thickness of the upper portion is 3 to 20 times thicker than the lower portion.

4. The multi-gate transistor of claim 3, wherein said lower portion is formed from said substrate, and wherein said upper portion is between 200 Å and 800 Å, and wherein said lower portion has a thickness between approximately 10 Å and 200 Å.

5. The multi-gate transistor of claim 1 wherein a channel portion of the upper portion between the source and drain regions is undoped.

6. The multi-gate transistor of claim 2 wherein said upper portion is composed of silicon-germanium having approximately 30 atomic percent of germanium.

7. The multi-gate transistor of claim 4 wherein said second band gap is 0.4 electron volts wider than said first band gap.

8. A multi-gate pMOS transistor comprising:

a fin disposed on a silicon substrate, the fin consisting of a silicon germanium alloy layer having a first band gap and a monocrystalline silicon layer having a second band gap wider than said first band gap and disposed below said silicon germanium alloy layer;

a shallow trench isolation (STI) dielectric disposed on the silicon substrate and adjacent to the fin, the fin extending from the silicon substrate through the isolation dielectric;

a gate structure comprising a mid-gap metal gate electrode and a high-K metal oxide gate dielectric, the gate structure having a first portion and a second portion, said first portion and second portion positioned on opposing sides of said fin and disposed over an undoped transistor channel comprising at least the silicon germanium alloy layer, the gate dielectric in contact with both the silicon germanium semiconductor layer and in contact with a second portion of the monocrystalline silicon layer extending above the STI dielectric; and a source region and a drain region fully contained within the silicon germanium alloy layer.

9. The multi-gate transistor of claim 8 wherein said gate structure further comprises a third portion positioned over said upper portion.

10. The multi-gate transistor of claim 8 wherein the first and second band gap creates a band gap offset between valence bands of the upper and lower portions which is at least 0.4 electron volts.

11. The multi-gate transistor of claim 8 wherein said lower portion is formed from said substrate.

12. The multi-gate transistor of 8 further comprising a gate insulator positioned between said gate structure and said fin.

13. The multi-gate transistor of claim 8 wherein said first band gap is at least 0.4 electron volts narrower than said upper portion.

14. The multi-gate transistor of claim 9 wherein said upper portion has a thickness of approximately 450 Å while the lower portion has a thickness of approximately 50 Å.

15. The multi-gate transistor of claim 13 wherein said upper portion is formed from silicon-germanium.

16. The multi-gate transistor of claim 15 wherein said upper portion contains approximately 50 atomic percent of germanium.

17. The multi-gate transistor of claim 16 wherein said substrate is silicon.

* * * * *